United States Patent
Schneider

(10) Patent No.: US 7,719,448 B2
(45) Date of Patent: May 18, 2010

(54) MECHANISM FOR CODING A NON-INCREASING SEQUENCE OF VALUES

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 26 days.

(21) Appl. No.: 12/154,613

(22) Filed: May 23, 2008

(65) Prior Publication Data

US 2009/0289820 A1    Nov. 26, 2009

(51) Int. Cl.
*H03M 7/30* (2006.01)
(52) U.S. Cl. .................. 341/76; 375/240.27
(58) Field of Classification Search .......... 707/100, 707/205; 382/232–253; 341/50–80; 375/240.27, 375/240.29, E7.17, E7.19
See application file for complete search history.

(56) References Cited

U.S. PATENT DOCUMENTS 6,762,700 B2 *   7/2004   Sun ........................... 341/52
7,336,831 B2 *   2/2008   Yeh ........................... 382/232
7,612,694 B1 * 11/2009   Schneider ..................... 341/51

OTHER PUBLICATIONS

U.S. Appl. No. 11/948,954, filed Nov. 30, 2007, Schneider.
U.S. Appl. No. 12/072,879, filed Feb. 27, 2008, Schneider.

* cited by examiner

*Primary Examiner*—Lam T Mai
(74) *Attorney, Agent, or Firm*—Blakely, Sokoloff, Taylor & Zafman LLP

(57) ABSTRACT

In one embodiment, a mechanism for coding a non-increasing sequence of values is disclosed. In one embodiment, a method includes receiving a sequence of values to encode, the sequence of values being non-increasing, encoding a first value of the sequence using a number of bits that are required for fully representing the first value in an encoded format, and for each subsequent value in the sequence, encoding the subsequent value using a number of bits required for a minimal bit encoding of a previous value in the sequence.

20 Claims, 5 Drawing Sheets

MECHANISM FOR CODING A NON-INCREASING SEQUENCE OF VALUES

TECHNICAL FIELD

The embodiments of the invention relate generally to data compression and, more specifically, relate to coding a non-increasing sequence of values.

BACKGROUND

Non-increasing sequences of values may be encountered in many areas of computer science. In particular, non-increasing sequences of values may be generated by a variety of compression techniques to represent different facets of the compression technique. For example, traditional entropy encoding compression algorithms may generate non-increasing sequences of values to model escape code counts, as described below. A mechanism to efficiently code these non-increasing sequences of values would be beneficial.

Traditional entropy encoding compression algorithms (such as Huffman coding, adaptive Huffman coding or arithmetic coding) depend on having a statistical model of the input stream they are compressing. The more accurately the model represents the actual statistical properties of symbols in the input stream, the better the algorithm is able to compress the stream. Loosely speaking, the model is used to make a prediction about what input symbol will come next in the input stream.

The probability model can be static (i.e., unchanging for the duration of a compression process) or adaptive (i.e., evolving as the compressor processes the input data stream). An adaptive model typically works by matching the current input symbol against its prediction context, and if it finds the current input symbol in its context, generating a code representing the particular probability range that the input symbol represents. For example, if the current input symbol is 'e' and the model predicts that the probability of 'e' is in the range 0.13 to 0.47, then the compressor would generate an output code representing that probability range. This "code and update" cycle is repeated until there are no more input symbols to compress.

When the compressor encounters a new symbol for which its model has no prediction, it must do something else. Consequently, a solution to address new symbols by the model includes encoding a special "escape" symbol to signal to the decompressor that the next symbol is a literal value. The escapes are used because the other option of including every possible symbol in every context leads to a poor performance (including possible data expansion).

Techniques have been discovered to determine optimal sequences of escape counts to assign to compression algorithm models to minimize the total number of bits generated for the coding stream. However, this optimal sequence of escape counts needs to be communicated between the various components of the compression algorithm model, and can lead to inefficiencies that nullify any gains obtained by determining the optimal sequence of escape counts. Many times, this sequence of escape counts is a non-increasing sequence of values. A mechanism to code a non-increasing sequence of values in an efficient manner for communication would be beneficial.

BRIEF DESCRIPTION OF THE DRAWINGS

The invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

Figure 1:
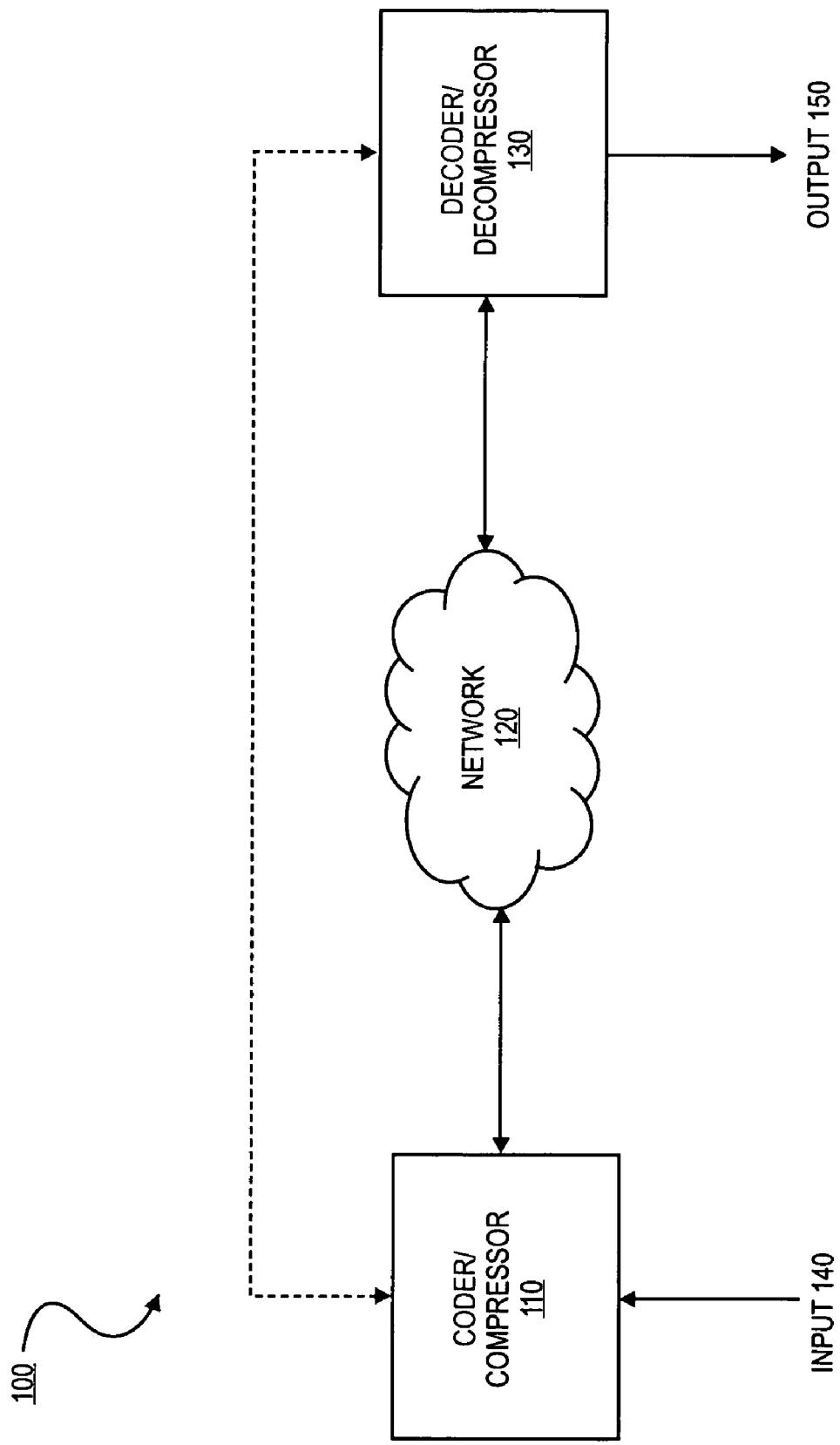
FIG. 1 is a block diagram depicting a system including an encoder and a decoder to perform embodiments of the invention.

Embodiments of the invention provide for coding a non-increasing sequence of values. In one embodiment, a method of coding a non-increasing sequence of values includes receiving a sequence of values to encode, the sequence of values being non-increasing, encoding a first value of the sequence using a number of bits that are required for fully representing the first value in an encoded format, and for each subsequent value in the sequence, encoding the subsequent value using a number of bits required for a minimal bit encoding of a previous value in the sequence.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "sending", "receiving", "attaching", "forwarding", "caching", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage, medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention is not described with reference to any particular programming language. It will be appreciated that a variety of programming languages may be used to implement the teachings of the invention as described herein.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Embodiments of the invention provide for coding a non-increasing sequence of values. In some embodiments, this coding of a non-increasing sequence of values may be utilized by various compression techniques to perform compression and decompression of a data stream. It is envisioned that embodiments of the invention may be utilized in a wide variety of data processing environments to compress and decompress any type of data stream in an optimal manner. The following description discusses an adaptive coding model an an exemplary implementation to enable a better understanding of embodiments of the invention. However, one skilled in the art will appreciate that embodiments of the invention are not limited to this specific implementation and may be applicable to a variety of areas utilizing compression techniques to minimize data space requirements.

FIG. 1 is a block diagram depicting a system including an encoder (or compressor) 110 and a decoder (or decompressor) 130 to perform embodiments of the invention. Encoder 110 and decoder 130 may connected via a network 120 or directly (shown by dashed line). In some embodiments, network 120 may be a LAN, an internet, an extranet, or the Internet.

As shown, encoder 110 receives an input data stream 140 for coding or compression. This input data stream 140 may encompass a variety of embodiments, such as a document or an email message. Encoder 110 codes or compresses input data stream 140 and sends it to decoder 130 directly or via network 120. Input data stream 140 may be coded or compressed for security purposes, . . . , etc. Decoder 130 decodes or decompresses the received data stream from encoder 110, and produces output data stream 150.

Figure 2:
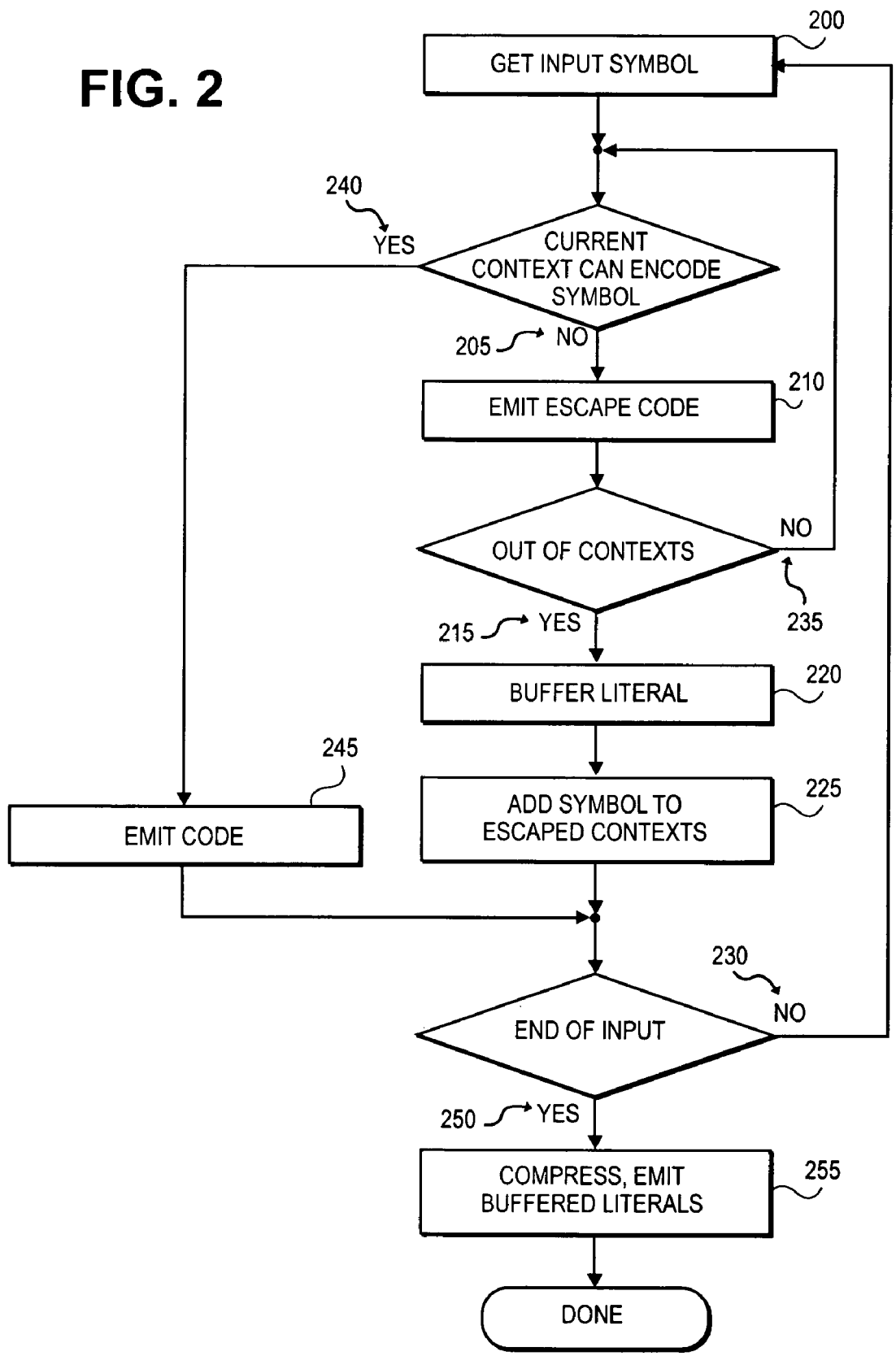
FIG. 2 shows an overview of an adaptive coding compression process according to an embodiment of the invention.

FIG. 2 is a flow diagram illustrating operations of an adaptive entropy coding compressor, which may utilize a non-increasing sequence of values according to some embodiments of the invention. The method of FIG. 2 may be performed by processing logic that may comprise hardware (e.g., circuitry, dedicated logic, programmable logic, microcode, etc.), software (such as instructions run on a processing device), or a combination thereof. In some embodiments, the method of FIG. 2 is performed by encoder/compressor 110 of FIG. 1.

The following explanation will track the compressor through the flow chart as it processes an input string, "abracadabra". Compression can be thought of as building a model of the input data and picking a minimal set of clues about the model to send to a decompressor, so that the decompressor can replicate the model and reproduce the input string.

Figure 3:
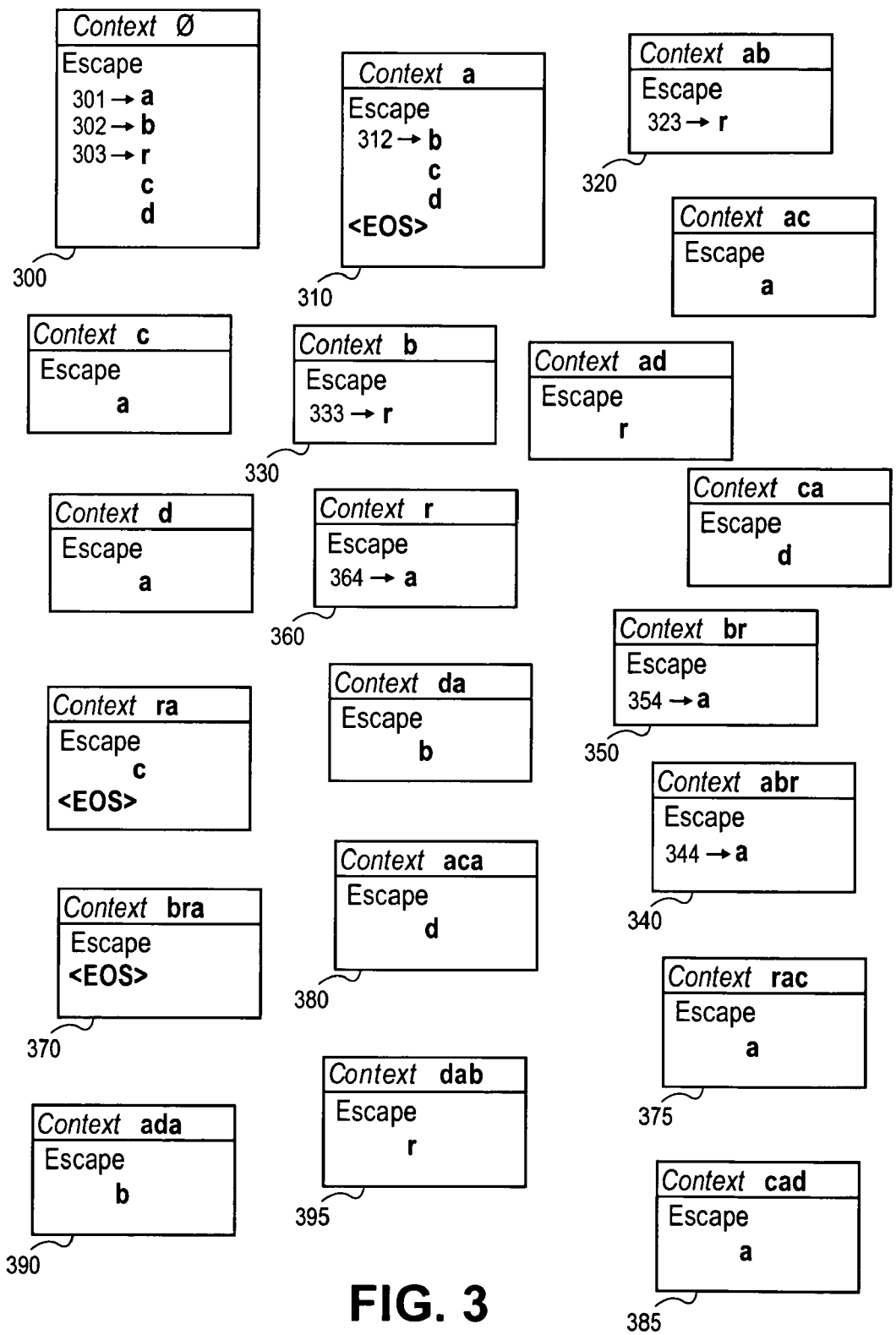
FIG. 3 shows the three-symbol contexts that are created as an embodiment of the invention compresses the string "abracadabra"

FIG. 3 shows "contexts" of the model according to certain embodiments of the invention. Each context corresponds to symbols the compressor has recently encoded (or symbols the decompressor has recently recovered). The compressor examined in this example uses three-symbol contexts (i.e., each context corresponds to the up to three most-recently-encountered input symbols). Shorter contexts (two-character, one-character, and no-character contexts) also appear in the model, which may be a parent of a longer context (e.g., next order context) in a tree structure. All the contexts together make up a probability model that, in some sense, represents estimates of the likelihood that a particular symbol will be seen at a certain point in the input.

Although all of the contexts, and the symbols each can encode, are shown in FIG. 3, they accumulate over time (as described below). The model starts out empty, with the initial context 300 (e.g., context Ø as a root context) able to encode only an escape symbol. The escape symbol is distinct from the 256 possible symbols that could be present in a stream of eight-bit characters.

The compressor retrieves the first input symbol (block 200), a. The current context, 300, cannot (yet) encode that symbol (block 205), so the compressor emits an escape token (block 210) and moves to a shorter context. As context 300 is the shortest (zero-character) context, the compressor is now out of contexts (block 215). As a result, it buffers the literal a (block 220) and adds a to each of the escaped contexts (block 225). In this case, the symbol a is added to context 300 (element 301 indicates the symbol a added to context 300). At this point, the compressor has not reached the end of its input (block 230), so it loops back to get the next input symbol (block 200), the symbol b. At this point in the compression, context "a" 310 can only encode an escape symbol. In some embodiments, the escape symbol is also referred to as "<Esc>" symbol, which may be considered implicit <Esc> symbol.

The next symbol in the string to compress is the symbol b. The compressor starts with the last context corresponding to the last symbol. This last context is context "a" 310. As context 310 cannot (yet) encode the symbol b (block 205), the compressor emits an escape token (block 210) and moves (e.g., escapes) to a shorter context. This shorter context is context 300 (e.g., the parent context of context "a"). As such, the compressor is not yet out of contexts (block 235), so it loops back to consider context 300.

Context 300 is also unable to encode the symbol b (block 205) (as it can currently encode only escape and a), so the compressor emits another escape token (block 210) and moves to a shorter context. However, context 300 is the shortest context, so the compressor is now out of contexts (block 215). The literal b is buffered and also added to each escaped context (blocks 302, 312), namely contexts 300 and 310. Thus far, the compressor has emitted three escapes and buffered two literals (a and b). Only the escape from context 300 on input symbol b required any bits to encode; all of the other escapes were from contexts that could only encode the escape and therefore did not require any bits to encode.

The next symbol to compress is r and the starting context for this character is ab 320, which corresponds to the last context with respect to "r" (e.g., for sequence of "abr" the last context having up to three symbols is context "ab"). Context 320 cannot encode the symbol r (block 205), so the compressor emits an escape token (block 210) and moves to the shorter context b 330 (e.g., parent context of context "b"). Context 330 also cannot encode the symbol r (block 205), so the compressor emits another escape token (block 210) and moves to the next-shortest context, which is context 300. Context 300 also cannot encode the symbol r (block 205), so the compressor emits another escape token (block 210), but is now out of contexts (block 215). As a result, the compressor creates a child context "r". Literal r is buffered and added to contexts 300, 320 and 330 (see 303, 323 and 333). The end of the input has still not been reached (block 230), so the compressor loops back yet again.

For the next input symbol, a, the compressor starts at context 340 and escapes through 340, 350 and 360 (adding coding 344, 354 and 364 to these contexts 350, 350, 360) before discovering that context 300 can encode the input symbol a (block 240). Therefore, the compressor emits the appropriate code (block 245) for the symbol a and loops back again.

The following Table 1 summarizes the activity of the compressor working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the compressor buffered a literal and updated one or more escaped-from contexts.

TABLE 1

| Symbol | Start Context | Escapes | Coding Context | Literal |
|---|---|---|---|---|
| a | 300 Ø | 1 | | a |
| b | 310 a | 2 | | b |
| r | 320 ab | 3 | | r |
| a | 340 abr | 3 | 300 | |
| c | 370 bra | 4 | | c |
| a | 375 rac | 3 | 300 | |
| d | 380 aca | 4 | | d |
| a | 385 cad | 3 | 300 | |
| b | 390 ada | 3 | 300 | |
| r | 395 dab | 3 | 300 | |
| a | 340 abr | | 340 | |
| <EOS> | 370 bra | 4 | | <EOS> |

After escaping from context 370 and buffering the end-of-stream (EOS) literal, the compressor determines that the end of input has been reached (block 250). Now, it compresses the buffered literals and emits them in a discernible position relative to the encoded data bits (for example, at the beginning of the encoded stream, at the end of the stream, or at a block boundary in the stream). It should be noted that an entropy coding data decompressor would operate in a similar manner to the compressor described with respect to FIGS. 2 and 3, except in a reverse manner.

Every entropy encoder strives to reduce the number of bits used to represent a block of data by trying to model the probabilities of the data items being coded (typically, this is bytes, but it can be bits or words). As described above, at the beginning of encoding, a substantial amount of escape tokens are emitted and thus, more bits may be needed to encode these escape tokens. However, if the escape token count starts at an optimal number, the number of bits required to encode the escape tokens may be substantially reduced. The more accurate this model, the fewer bits are needed for the encoding. One problem with adaptive coding models is how to account for codes that do not occur in the context driving your coding. Escapes are used because including every possible symbol in every context leads to a poor performance (including possible data expansion).

One technique to predict an optimum escape initial count and step count (e.g., a step size for increment or decrement) may utilize a heuristic model based on an initial chunk of symbols of an input stream having a sequence of symbols or literals. Once the optimum initial escape count and the step count are determined, a context when initially created is initialized using the optimum initial escape count and step count. As a result, the number of bits required to encode the input stream may be greatly reduced.

The problem with escapes is that if they are treated like regular symbols, their implied probability will increase as they actually become a good deal less probable. One solution to address this problem uses (prior to encoding the symbols using the techniques set forth above) a prefix of the input stream, such as, for example, the first 64K of symbols, to determine what the appropriate counts are for the escape at each stage of the model evolution to minimize the number of bits.

Based on a series of mathematical functions and probabilities beyond the scope of embodiments of the invention, assume that a sequence of optimal escape counts has been determined for the adaptive coding model and ABRACADABRA example described above, with values of 255, 255, 3, 3, and 1. This sequence of escape counts may be prepended to the compressed data stream. Coding for these values is possible using as low as 45 bits for this example.

Once the information regarding the optimum escape token count and step count for each stage of encoding is determined, this information should be communicated between an encoder and a decoder performing the compression and decompression of the data stream. Embodiments of the invention provide a mechanism for coding a non-increasing sequence of values, such as the optimum sequence of escape token values calculated above, to make the size of the encoded sequence as small as possible.

Any non-increasing sequence may take advantage of embodiments of the invention. In some embodiments, it is not strictly necessary that the sequence itself be non-increasing. Rather, as long as the ceiling of the binary logarithm of the sequence is non-increasing, embodiments of the invention may be applicable. For example, the sequence 255, 135, 193, 5, 7, 2, 3, 1 may be coded utilizing embodiments of the invention, as the ceiling of the binary logarithm of this sequence is non-increasing.

With reference to the ABRCADABRA example, the first time an escape is encoded, it is given a count of 255. Then, the next time the escape is encoded it is also given a count of 255. For the subsequent encoding of escape values, the escape count is set at 3, then 3, and finally 1. This is the exact sequence of what the escape count values should follow in order to give the least number of bits of coding output, with the constraint that the counts for the escapes are non-increasing.

More specifically, if the ABRACADABRA example is walked through step-by-step, the optimal impact the escape sequence has on the coding can be seen. First, the symbol a is received for encoding and the escape has probability of 1. Subsequently, the escape has count of 255 and a has count of 1. Then, the escape for the symbol b has a probability of 255/256. Next, the escape has a count of 255, and the probability of escape for r is 255/257. After that, the count for the escape decreases to 3, with the result of the symbol a having a probability of $\frac{1}{6}$ for encoding. The symbol c has a probability of $\frac{3}{7}$ for encoding because it requires an escape and the escape count is down to 3. The next symbol, a, has a probability of $\frac{2}{8}$ as its escape probability is still at 3. The symbol d gets generated and its escape probability is $\frac{3}{8}$. Subsequently, the symbol a has a probability of $\frac{3}{8}$ for encoding, the symbol b has a probability of ⅕, and the symbol r has a probability of 1/10. Lastly, the final symbol, a, has a probability of 4/11 for encoding.

In summary, with the constraints that escapes have a count of 255 or less and the sequence of escape counts is non-increasing, the above escape value sequence provides the optimal values that minimize the total number of bits that would be generated for the coding stream. In other words, the sequence maximized the probability of the code actually generated in relation to all possible codes at that point. Embodiments of the present invention deal with how to encode such a particular sequence for communication between the various components utilizing the sequence.

Figure 4:
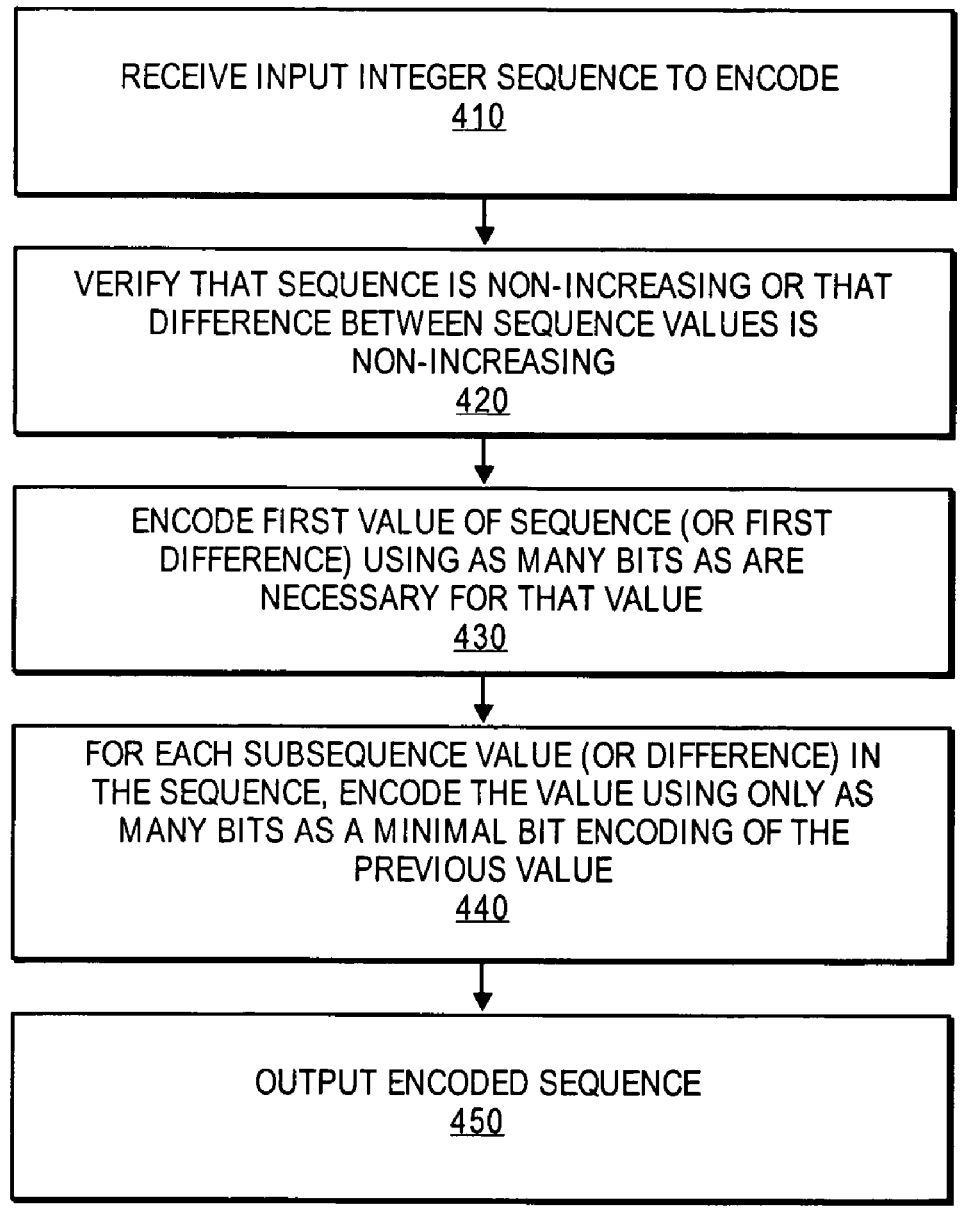
FIG. 4 is a flow diagram depicting a method to code a non-increasing sequence of integer values according to one embodiment of the invention.

FIG. 4 is a flow diagram illustrating a method 400 for coding a non-increasing sequence of values according to an embodiment of the invention. Method 400 may be performed by processing logic that may comprise hardware (e.g., circuitry, dedicated logic, programmable logic, microcode, etc.), software (such as instructions run on a processing device), or a combination thereof. In some embodiments, the method 400 is performed by either of encoder/compressor 110 or decoder/decompressor 130 of FIG. 1.

Method 400 begins at block 410 where an input integer sequence to be encoded is received. Then, at block 420, it is verified that the sequence is non-increasing. Alternatively, instead of a non-increasing sequence, a sequence with non-increasing differences between the values may also be encoded by embodiments of the invention. If the sequence, starts with fairly large values, it is sometimes better to code the differences, rather than the values themselves directly, using a compact coding technique. In one embodiment, this technique is advantageous in the case where several sequential items have sequential differences of less than 127, but the items themselves would require more than 8 bits to encode.

At block 430, the first value of the sequence (or, in some embodiments, the first difference value) is encoded using a typical number of bits that are necessary for that value. Then, at block 440, for each subsequent value in the sequence (or each subsequent difference value), the value is encoded using only as many bits as a minimal bit encoding of the previous value. For example, if the sequence 255, 255, 3, 3, 1 is to be encoded by embodiments of the invention, it would require 8 bits for each of the first three values (e.g., for 255, 255, and 3), but only 2 bits for each of the last two values (e.g., for 3 and 1). This follows from the fact that 3 can be represented in 2 bits, and the sequence is non-increasing. Because it is known when the second 3 value is received that there will not be anything bigger than the previous 3 value (due to constraint of non-increasing sequence), this second 3 value will only need 2 bits to encode similar to the previous value of 3. Finally, at block 450, the encoded sequence of values is outputted. In some embodiments, this outputted sequence is sent to a decoder for decompression and use in an adaptive compression algorithm.

Embodiments of the invention, as described above with respect to FIG. 4, code the first value using the typical number of bits needed for the value being encoding. Then, once a point is reached where that number of bits is no longer needed, the next lower number of bits is used, and so on. For the specific sequence of 255, 255, 3, 3, 1, the following illustration is helpful. First, coding the value 255 involves setting all 8 bits of an 8 bit value. Then, coding the second 255 value also takes setting all 8 bits. Next, to code the 3 value, another 8 bits are required (6 bits of 0 and 2 bits of 1) because the previous value of 255 used 8 bits.

For the second 3 value, due to the non-increasing sequence constraint, it is known that this value cannot be any bigger than the previous 3 value, which only set 2 bits of the 8 utilized. As a result, this second 3 value only takes 2 bits to encode. Finally, the subsequent 1 value takes only 2 bits to encode. Overall, instead of needing 40 bits of output, embodiments of the invention have reduced the output by 12 bits to 28 bits (taking 6 bits off of each of the last 2 numbers).

Figure 5:
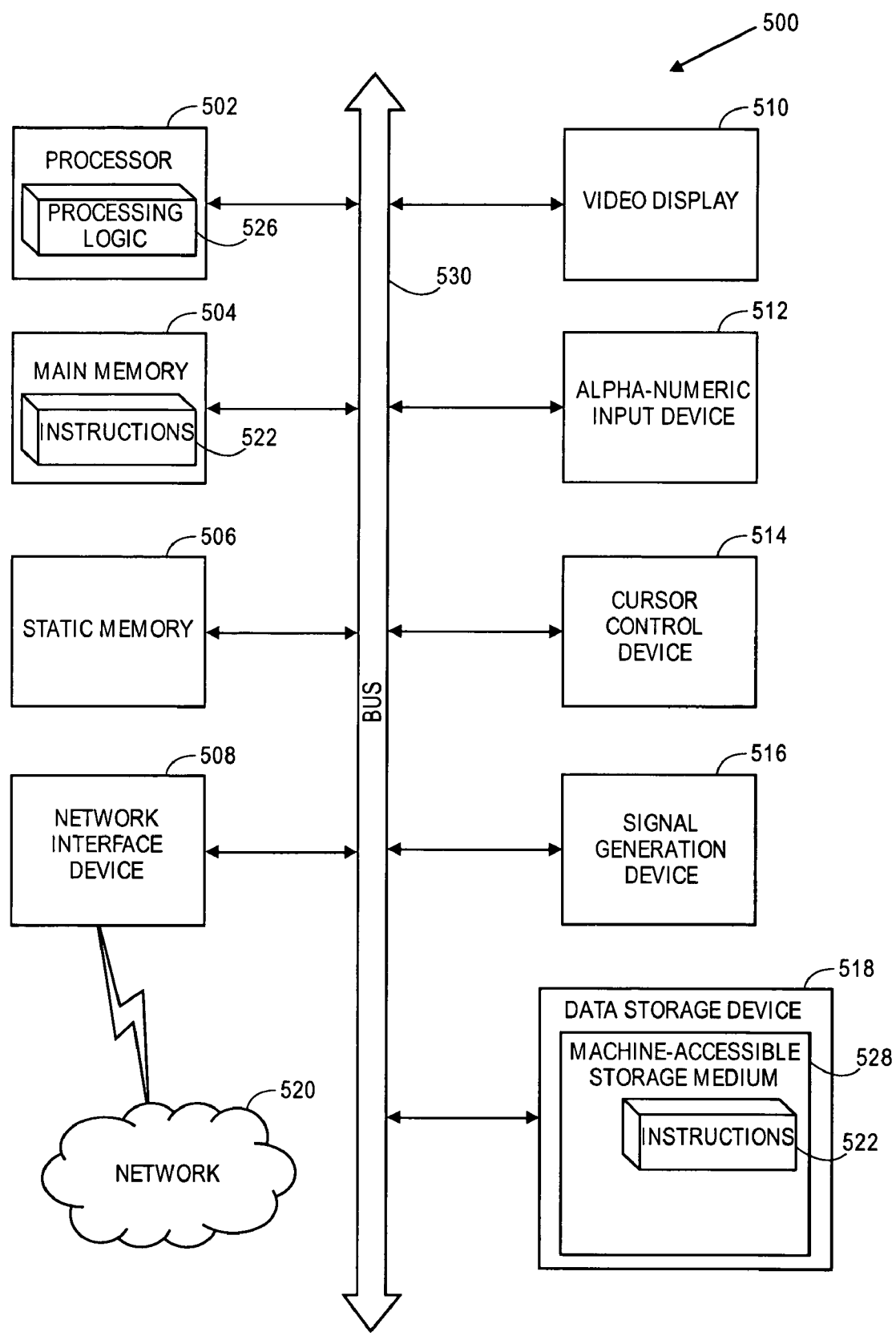
FIG. 5 illustrates a block diagram of one embodiment of a computer system.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a LAN, an internet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. For example, system 500 may be used as part of a system, such as an encoder 110 or a decoder 130 described with respect to FIG. 1, to perform the coding processes set forth above.

The exemplary computer system 500 includes a processing device 502, a main memory 504 (e.g., read-only memory (ROM), flash memory, dynamic random access memory (DRAM) (such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

Processing device 502 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute the processing logic 526 for performing the operations and steps discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The data storage device 518 may include a machine-accessible storage medium 528 on which is stored one or more set of instructions (e.g., software 522) embodying any one or more of the methodologies of functions described herein. The software 522 may also reside, completely or at least partially, within the main memory 504 and/or within the processing device 502 during execution thereof by the computer system 500; the main memory 504 and the processing device 502 also constituting machine-accessible storage media. The software 522 may further be transmitted or received over a network 520 via the network interface device 508.

The machine-readable storage medium 528 may also be used to store instructions that perform the coding processes set forth above, and/or a software library may contain the methods that call the above applications. While the machine-accessible storage medium 528 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instruction for execution by the machine and that cause the machine to perform any one or more of the methodologies of the present invention. The term "machine-accessible storage medium" shall accordingly be taken to include, but not be limited to, solid-state memories, and optical and magnetic media.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A computer-implemented method, comprising:
   receiving a sequence of values to encode, the sequence of values being non-increasing;
      encoding, by an encoder, a first value of the sequence using a number of bits that are required for fully representing the first value in an encoded format; and
      for each subsequent value in the sequence, encoding, by the encoder, the subsequent value using a number of bits required for a minimal bit encoding of a previous value in the sequence.

2. The method of claim 1, further comprising outputting the encoded sequence to a decoder for utilization in a compression algorithm on an input data stream.

3. The method of claim 1, wherein the sequence of values is a sequence of escape counts utilized in an adaptive compression algorithm.

4. The method of claim 1, wherein the sequence of values is a sequence of differences between values in another sequence.

5. The method of claim 4, wherein the another sequence is a sequence of escape counts utilized in an adaptive compression algorithm.

6. The method of claim 1, wherein the sequence of values is integer values falling within the range of 0 to 255.

7. The method of claim 1, further comprising verifying that the sequence of values is non-increasing.

8. A system, comprising:
   a processor;
   a memory communicably coupled to the processor to store a sequence of values to encode, the sequence of values being non-increasing; and
   an encoder communicably coupled to the processor and the memory, the encoder operable to:
   receive the sequence of values;
   encode a first value of the sequence using a number of bits that are required for fully representing the first value in an encoded format; and
   for each subsequent value in the sequence, encode the subsequent value using a number of bits required for a minimal bit encoding of a previous value in the sequence.

9. The system of claim 8, wherein the encoder further to output the encoded sequence to a decoder for utilization in a compression algorithm on an input data stream.

10. The system of claim 8, wherein the sequence of values is a sequence of escape counts utilized in an adaptive compression algorithm.

11. The system of claim 8, wherein the sequence of values is a sequence of differences between values in another sequence.

12. The system of claim 11, wherein the another sequence is a sequence of escape counts utilized in an adaptive compression algorithm.

13. The system of claim 8, wherein the sequence of values is integer values falling within the range of 0 to 255.

14. The system of claim 8, wherein the encoder further to verify that the sequence of values is non-increasing.

15. An article of manufacture comprising a machine-readable storage medium including data that, when accessed by a machine, cause the machine to perform operations comprising:
   receiving a sequence of values to encode, the sequence of values being non-increasing;
   verifying that the sequence is non-increasing;
   encoding a first value of the sequence using a number of bits that are required for fully representing the first value in an encoded format; and
   for each subsequent value in the sequence, encoding the subsequent value using a number of bits required for a minimal bit encoding of a previous value in the sequence.

16. The article of manufacture of claim 15, wherein the machine-readable storage medium includes data that causes the machine to perform further operations comprising outputting the encoded sequence to a decoder for utilization in a compression algorithm on an input data stream.

17. The article of manufacture of claim 15, wherein the sequence of values is a sequence of escape counts utilized in an adaptive compression algorithm.

18. The article of manufacture of claim 15, wherein the sequence of values is a sequence of differences between values in another sequence.

19. The article of manufacture of claim 18, wherein the another sequence is a sequence of escape counts utilized in an adaptive compression algorithm.

20. The article of manufacture of claim 15, wherein the sequence of values is integer values falling within the range of 0 to 255.

* * * * *